(12) United States Patent
Haid et al.

(10) Patent No.: US 7,477,552 B2
(45) Date of Patent: Jan. 13, 2009

(54) APPARATUS AND METHOD FOR REDUCING LEAKAGE CURRENTS OF INTEGRATED CIRCUITS HAVING AT LEAST ONE TRANSISTOR

(75) Inventors: Josef Haid, Graz (AT); Thomas Kuenemund, Munich (DE); Thomas Leutgeb, Lieboch (AT); Bernd Zimek, Graz (AT)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 11/668,214

(22) Filed: Jan. 29, 2007

(65) Prior Publication Data

US 2008/0170458 A1    Jul. 17, 2008

(30) Foreign Application Priority Data

Jan. 15, 2007    (DE) .................. 10 2007 002 150

(51) Int. Cl.
*G11C 5/14* (2006.01)
*G11C 11/00* (2006.01)

(52) U.S. Cl. .................. 365/189.09; 365/154; 365/226
(58) Field of Classification Search ............. 365/189.09
See application file for complete search history.

(56) References Cited

U.S. PATENT DOCUMENTS

| 5,581,500 | A | | 12/1996 | D'Souza | |
|---|---|---|---|---|---|
| 5,732,015 | A | * | 3/1998 | Kazerounian et al. | 365/154 |
| 5,894,433 | A | * | 4/1999 | Itoh et al. | 365/154 |
| 7,196,960 | B2 | * | 3/2007 | Isoda et al. | 365/227 |
| 7,200,030 | B2 | * | 4/2007 | Yamaoka et al. | 365/154 |
| 7,307,907 | B2 | * | 12/2007 | Houston | 365/222 |
| 2005/0185450 | A1 | | 8/2005 | Isoda et al. | |

* cited by examiner

*Primary Examiner*—Son L Mai
(74) *Attorney, Agent, or Firm*—Dickstein, Shapiro, LLP.

(57) ABSTRACT

An apparatus for reducing leakage currents of an integrated circuit having at least one transistor, wherein the at least one transistor is connected between a supply potential and a first reference potential, the apparatus including a controller for controlling the first reference potential in dependence on the supply potential.

22 Claims, 7 Drawing Sheets

APPARATUS AND METHOD FOR REDUCING LEAKAGE CURRENTS OF INTEGRATED CIRCUITS HAVING AT LEAST ONE TRANSISTOR

CROSS-REFERENCE TO RELATED APPLICATION

This application claims priority from German Patent Application No. 102007002150.1, which was filed on Jan. 15, 2007 and is incorporated herein by reference in its entirety.

BACKGROUND

The present invention relates to a concept for reducing leakage currents of integrated circuits having at least one transistor, such as it can be used, for example, for reducing leakage currents in SRAM memory devices (SRAM=static random access memory).

Suppression or reduction, respectively, of leakage currents in integrated circuits is necessary to keep the power consumption of integrated circuits, such as SRAM memory devices, low. Power consumption by leakage currents can be substantially reduced by applying a technique known as "source biasing" in the art. This rises a potential at the source terminal of a transistor, wherein the bulk voltage remains on a reference potential or a ground potential, respectively. The power consumption by leakage currents can significantly influence the whole power consumption of a system and thus determine the life time of batteries, such as in mobile phones or PDAs (PDA=personal digital assistant).

Examples for integrated circuits are, for example, SRAM memory devices, which contribute disproportionately to leakage currents of integrated circuits due to their structure, particularly the NMOS and PMOS transistors found therein.

When an SRAM memory module is not accessed, for example in an energy-saving mode, the SRAM memory module has to be supplied with a data retention voltage, so that data stored in the memory module will not get lost. Thereby, the data retention voltage is normally the minimum required difference between a supply voltage $V_{DD}$ and the reference potential or ground potential $V_{SS}$, respectively, of an integrated circuit, to retain stored data of the integrated circuit. If the applied data retention voltage of the SPAM memory device is above a minimum required value, power dissipation by leakage currents, for example of drain terminals to source terminals of MOS transistors of the SRAM memory cell is unnecessarily high. If, however, the data retention voltage of the SRAM memory cell sinks below the minimum required value, the risk of data loss increases.

One possibility for reducing leaking currents of integrated circuits is, for example, to use a so-called virtual ground or a virtual ground potential, respectively, when the respective integrated circuit is not accessed ("sleep mode"). Typically, integrated circuits are connected between a supply potential $V_{DD}$ and a reference potential or ground potential $V_{SS}$, respectively. If the integrated circuit is not accessed in a sleep mode, a fixed virtual ground potential $V_{SS,virt}$ is used, which is, in amount, between the ground potential $V_{SS}$ and the supply potential $V_{DD}$. Thereby, due to a lower difference of supply potential $V_{DD}$ and virtual ground potential $V_{SS,virt}$, compared to the difference of supply potential $V_{DD}$ and actual ground potential $V_{SS}$, lower leakage currents of the transistors of an integrated circuit result.

The fixed virtual ground potential $V_{SS,virt}$ has the disadvantage that with the same, a transistor circuit is not robust to variations of the supply voltage or operating voltage $V_{DD}$, respectively. Variations of the supply voltage $V_{DD}$ are, for example, caused by a weak or pulsating energy supply, respectively. If the supply voltage $V_{DD}$ sinks below a critical value $V_{DD,min}$, the potential difference resulting from $V_{DD,min}$ and the virtual ground potential $V_{SS,virt}$ is no longer sufficient to guarantee data retention in the SRAM memory cell.

SUMMARY OF THE INVENTION

According to embodiments, the present invention provides an apparatus for reducing leakage current of an integrated circuit having at least one transistor, which is connected between a supply potential and a first reference potential, having a means for controlling the first reference potential in dependence on the supply potential.

Thus, embodiments of the invention have the advantage that by respectively controlling or regulating the first reference potential or the virtual ground potential $V_{SS,virt}$, respectively, in dependence on the supply potential $V_{DD}$, a reduction of leakage currents of transistors can be obtained with simultaneous robustness of a circuit to strong variations of the supply potential $V_{DD}$.

BRIEF DESCRIPTION OF THE DRAWINGS

Preferred embodiments of the present invention will be discussed below with reference to the accompanying drawings. They show.

DETAILED DESCRIPTION

With regard to the following description, it should be noted that in the different embodiments, similar or equal function elements have the same reference numbers and thus the description of these functional elements in the different embodiments illustrated below can be interchanged.

In the following, the inventive concept for reducing leakage currents of integrated circuits having at least one transistor is described with regard to SRAM memory devices, since the same represent a significant proportion of typical integrated circuits and contribute disproportionately to leakage currents of integrated circuits due to their structure, particularly the NMOS and PMOS transistors found therein. It should be noted that the inventive concept can also be applied to other integrated circuits, where leakage currents occur.

Figure 1:
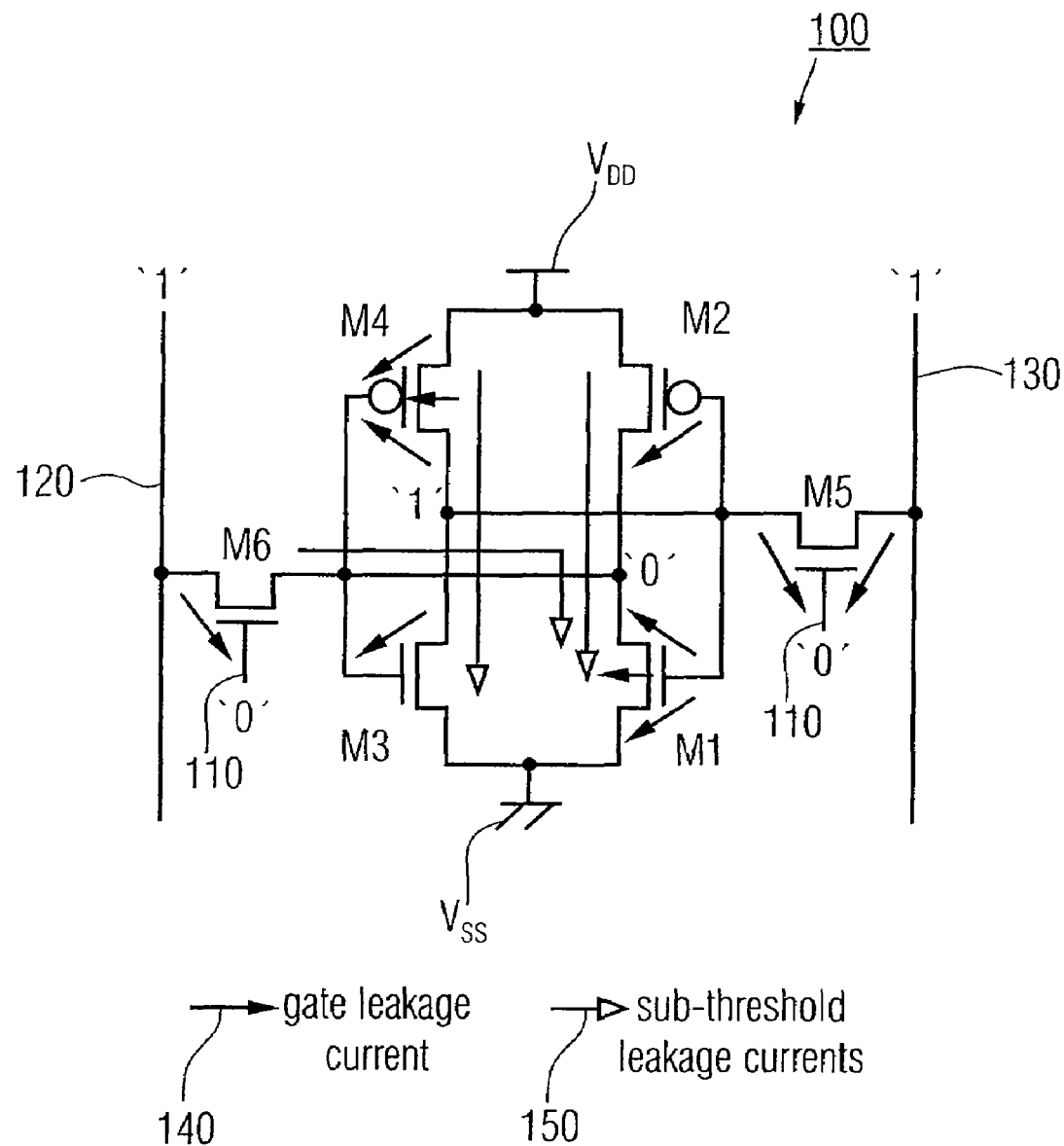
FIG. 1 an illustration of a conventional six-transistor SRAM memory cell, which is connected between a supply potential and a ground potential.

FIG. 1 shows a conventional 6T-SRAM memory cell, comprising six MOS transistors M1 to M6 as well as a word line 110, a bit line 120 and an inverting bit line 130.

The word line 110 is connected to the gate terminal of an NMOS transistor M6. The bit line 120 is connected to the drain terminal of the NMOS transistor M6. The source terminal of the NMOS transistor M6 is connected both to the gate terminal of a PMOS transistor M4 and to the gate terminal of an NMOS transistor M3. Further, the source terminal of the NMOS transistor M6 is connected to the source terminal of a PMOS transistor M2 and the drain terminal of an NMOS transistor M1. The drain terminals of the two PMOS transistors M2 and M4 are each connected to a supply potential terminal $V_{DD}$. The source terminals of the two NMOS transistors M1 and M3 are each connected to a ground potential terminal $V_{SS}$. The word line 110 is further connected to the gate terminal of a further NMOS transistor M5, whose drain terminal is connected to the inverting bit line 130. The source terminal of the NMOS transistor M5 is connected both to the gate terminal of the PMOS transistor M2 and to the gate terminal of the NMOS transistor M1. Further, the source terminal of the NMOS transistor M5 is connected to the source terminal of the PMOS transistor M4 and the drain terminal of the NMOS transistor M3.

The SRAM memory cell shown in FIG. 1 forms a base for most SRAM memories in CMOS technology. The six transistors M1 to M6 are used to store one bit and to make the same accessible. The four transistors M1 to M4 form two cross-connected inverters. Due to the coupling structure, a low input signal ("0") for the first inverter (M2, M3) generates a high value ("1") at the input of the second inverter (M1, M4). In a similar way, a high input signal for the first inverter generates a low input signal for the second inverter, which couples the low input signal back to the first inverter. In this way, the two inverters each store their current logic state. The input of the first inverter and the output of the second inverter are connected to the bit line 120 via the transistor M6. Conversely, the input of the second inverter and the output of the first inverter are connected to the inverting bit line 130 via the transistor M5. The gate terminals of the two transistors M5 and M6 are each connected to the word line 110. As long as a logical zero is applied to the word line 110, the SRAM memory cell 100 is separated from the two bit lines 120 and 130. In this case, the two inverters supply themselves with data due to the feedback loop, and the SRAM memory cell 100 stores their current value.

If a logical one is applied to the word line 110, the two transistors M5 and M6 are conductive and connect the respective inverter inputs and outputs to the two bit lines 120 and 130. In this way, data can be read from or written into the SRAM memory cell 100, respectively.

Leakage currents of the SPAM memory cell 100 are mainly caused by the paths designated by arrows 140 and 150 in FIG. 1. The paths indicated by the reference number 140 are so-called gate leakage currents, and the paths designated by reference number 150 are so-called sub-threshold voltage leakage currents.

Sub-threshold voltage leakage currents flow from the drain terminal via the inversion layers lying below the gate to the source terminal when the transistor operates in the cutoff region.

Due to the fact that the dimensions of devices in integrated circuits become smaller and smaller, leakage currents can make up to 50% of the whole power consumption of integrated circuits. An introduction of a so-called virtual ground or virtual ground potential $V_{SS,virt}$, respectively, significantly reduces several components of these leakage currents. This is, for example, used in chip card controllers. The concept of the virtual ground or the virtual ground potential $V_{SS,virt}$ is schematically illustrated in FIG. 2.

Figure 2:
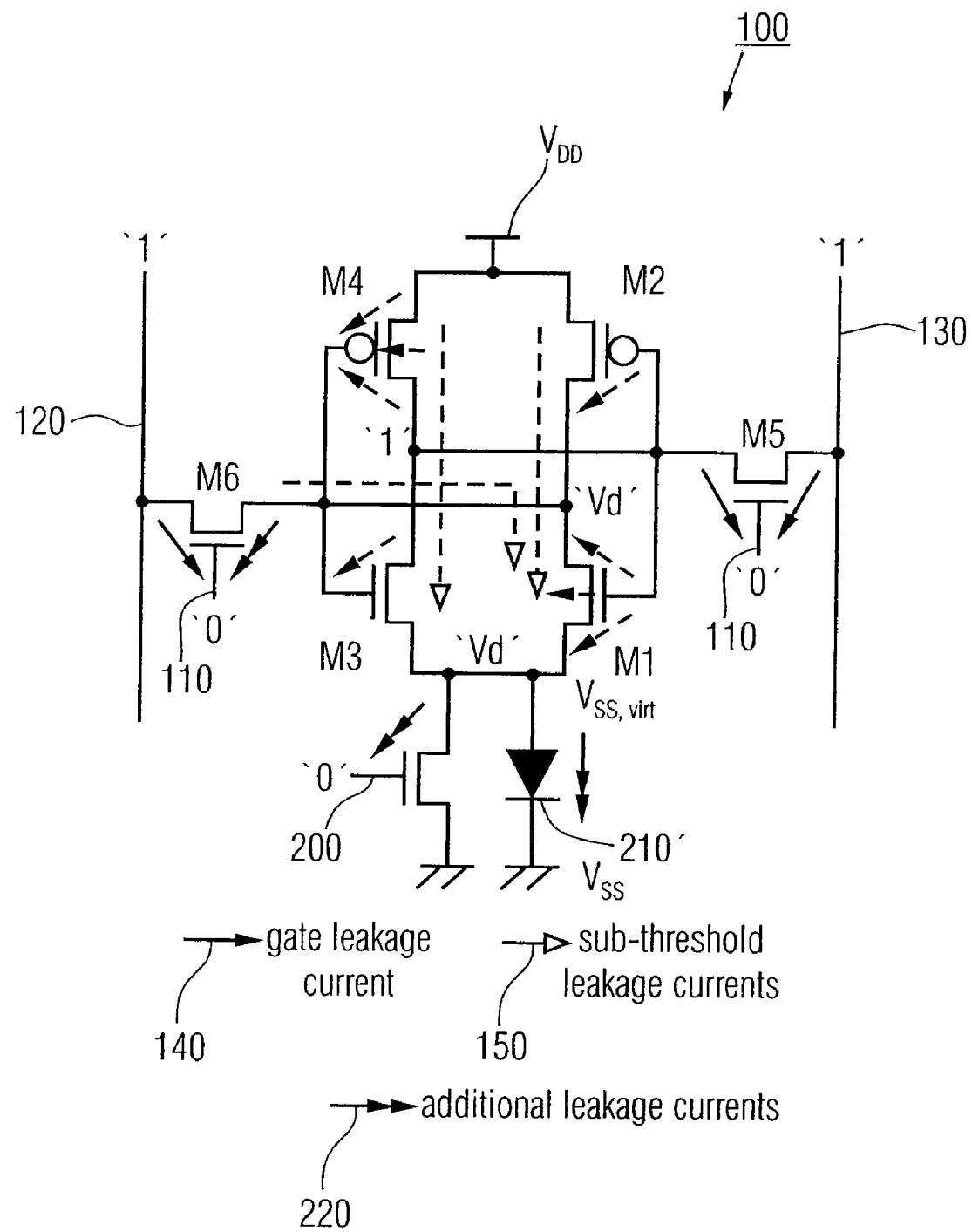
FIG. 2 a conventional six-transistor SRAM memory cell, which is connected between a supply potential and a fixed virtual ground potential.

FIG. 2 shows the 6 T-SRAM memory cell already described in FIG. 1, which additionally comprises a further NMOS transistor 200 and a diode 210.

The NMOS transistor 200 and the diode 210 are connected in parallel between the source terminals of the transistors M1 and M3 and the ground potential $V_{SS}$. Thereby, the potential at the two source terminals of the transistors M1 and M3 each rises from the reference potential $V_{SS}$ to a virtual ground potential $V_{SS,virt}$. Compared to the actual ground potential $V_{SS}$, the virtual ground potential $V_{SS,virt}$ is increased by the forward voltage of the diode 210 or the drain source voltage of the transistor 200, respectively. By this measure, gate leakage currents and sub-threshold voltage leakage currents can be reduced. However, by adding the transistor 200 and the diode 210, additional leakage currents result, as they are designated by the arrows with the reference number 220.

The circuit shown in FIG. 2 can reduce leakage currents at a fixed supply potential $V_{DD}$, but the circuit is at the same time not robust to variations of the supply voltage $V_{DD}$. Such variations of the supply voltage $V_{DD}$ can, for example, be caused by a weak of pulsating energy supply, respectively.

Generally, the voltage level of the virtual ground potential $V_{SS,virt}$ is predefined in dependence on tolerances of the supply voltage $V_{DD}$. The higher the tolerances of the supply voltage $V_{DD}$, the lower the level of the virtual ground potential $V_{SS,virt}$ must be. The lower the level of the virtual ground potential $V_{SS,virt}$, the lower the obtainable savings with regard to the leakage currents will be. When the supply potential $V_{DD}$ varies greatly, for example during short periods when the voltage supply provides no energy, it is likely that a fixed virtual ground potential $V_{SS,virt}$ cannot be used.

An example where the voltage supply supplies no energy can be found, for example, in contactless communications, particularly in RFID systems (RFID=radio frequency identification). There, data are transmitted by modulating an RF field, whereby, for example, a so-called 100% modulation can be used. This means there are times during communication where no energy is transmitted from a read/write device to a chip card. The current consumed by the chip card during this time has to be supplied from supporting capacities. The smaller the technology in which the card is produced, the higher the proportion of the leakage current, which again depends heavily on the RAM leakage current. Thus, reducing the RAM leakage current has significant advantages for data retention times of the memories during the described supply interruption. A schematic illustration of a digital modulation, such as it is used in an RFID system, is shown in FIG. 3.

Figure 3:
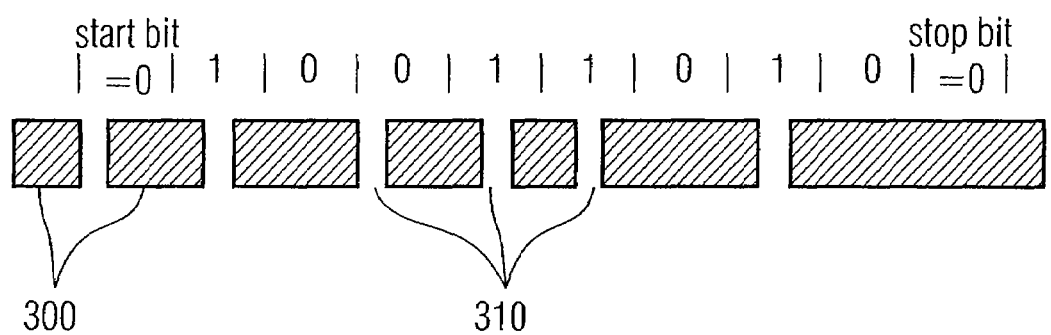
FIG. 3 a schematic illustration of a digital modulation method for contactless communication.

The energy transmission schematically shown in FIG. 3 results, for example, when so-called amplitude keying is used as modulation method. In amplitude keying, the amplitude of a carrier wave is switched between two states by a binary code signal. In the example shown in FIG. 3, in a first state 300, energy is transmitted from a write/read device to a chip card, and in a second state 310 no energy is transmitted, as it has already been described above.

If it is assumed that $(V_{DD}-V_{SS,virt})$ has to be, for example, always higher than 0.7 volt to guarantee data retention in the SPAM memory cell illustrated in FIG. 2, and if it is further assumed that the supply voltage $V_{DD}$ can vary up to a minimum supply voltage $V_{DD,min}$, the following calculating examples result. At a typical supply voltage $V_{DD,type}=1.5$ V and a minimum supply voltage $V_{DD,min}=1.35$ V, a virtual ground potential of $V_{SS,virt}=0.65$ V results, under the assumption that $(V_{DD}-V_{SS,virt})\geq0.7$ V. $V_{SS,virt}=0.65$ V can, for example, be realized with the circuit shown in FIG. 2. Thus, this is a stable system. If a minimum supply voltage $V_{DD,min}=0.9$ V, the required virtual ground potential $V_{SS,virt}$ is 0.2 V according to the above considerations. Such a low $V_{SS,virt}$ cannot be guaranteed with the circuitry shown in FIG. 2, and thus this is an unstable system, where data losses can occur.

Figure 4:
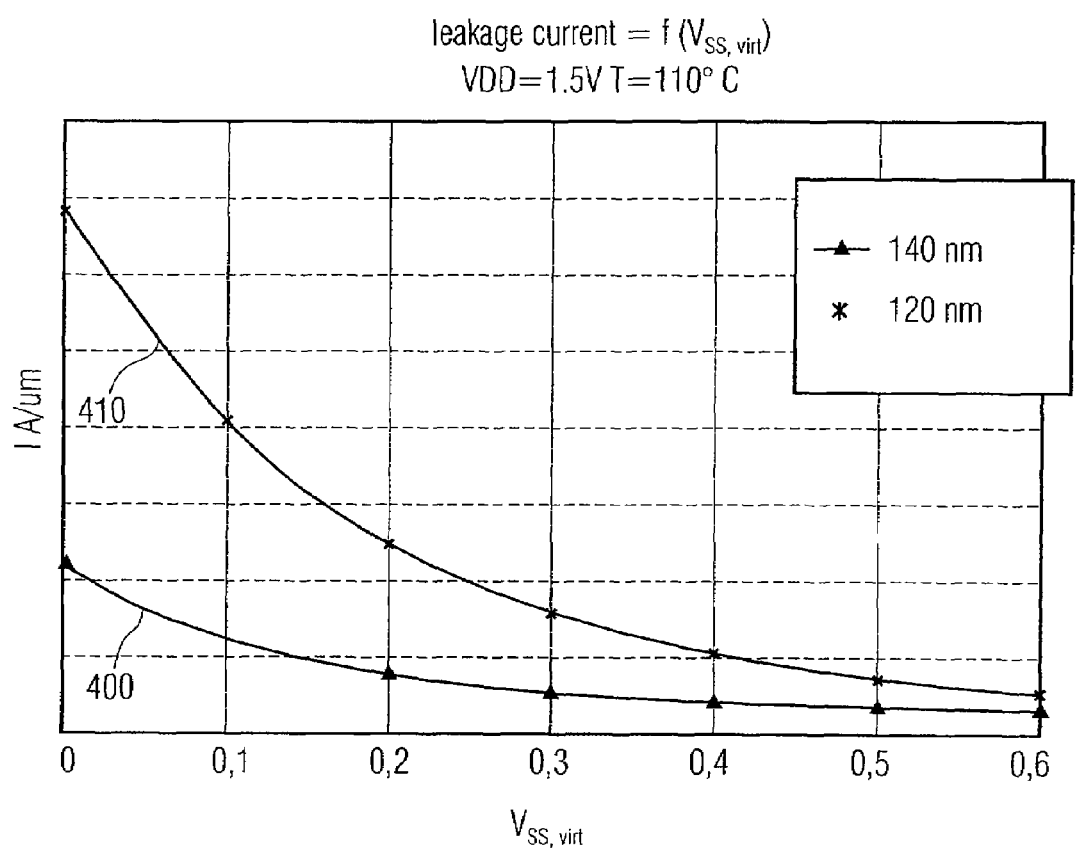
FIG. 4 an illustration of leakage currents in an SRAM memory cell plotted against different levels of a virtual ground potential.

FIG. 4 shows a schematic curve of leakage currents plotted against the virtual ground potential $V_{SS,virt}$ at a supply voltage $V_{DD}=1.5$ V assumed to be constant and a temperature T=110° C.

FIG. 4 shows two curves 400 and 410 of leakage currents of different transistors plotted against the virtual ground potential $V_{SS,virt}$. The curve designated by reference number 400 shows the leakage current curve of a transistor having a drain source channel length of 140 nanometers. The curve indicated with the reference number 410 shows the leakage current curve of a transistor having a drain source channel length of 120 nanometers. Thus, when the technology becomes smaller, the tendency of the leakage current is "upwards".

Based on the simulated leakage current curves shown in FIG. 4, in dependence on the virtual ground potential $V_{SS,virt}$, it can be seen that significant saving potentials can be provided with regard to leakage currents, at a supply potential $V_{DD}$ of 1.5 volt with increasing virtual ground potential $V_{SS,virt}$, depending on the transistor type. Particularly high saving potentials are provided in the transistors having short channel lengths (120 nm), as can be seen with regard to the leakage current 410 in FIG. 4. If the leakage current at a virtual ground potential $V_{SS,virt}=0.2$ V for this curve is compared to a virtual ground potential $V_{SS,virt}=0.6$ V, it can be seen that at $V_{SS,virt}=0.6$ V, up to 70% of the leakage current that prevails at $V_{SS,virt}=0.2$ V can be saved.

In order to be able to maintain an improved reduction of leakage currents of MOS transistors even at strong variations of the operating voltage $V_{DD}$, with simultaneous robustness of the circuit to the heavy variations of the operating voltage, embodiments of the present invention have an apparatus for reducing leakage currents of a transistor connected between the supply potential $V_{DD}$ and a first reference potential or the virtual ground potential $V_{SS,virt}$, respectively, with a means for respectively controlling or regulating the first reference potential or the virtual ground potential $V_{SS,virt}$, respectively.

According to an embodiment of the present invention, the control of the first reference potential or the virtual ground potential $V_{SS,virt}$, respectively, is performed by the means for controlling in dependence on the supply potential $V_{DD}$. Thus, according to embodiments of the present invention, the virtual ground potential $V_{SS,virt}$ is a function of the supply potential $V_{DD}$, i.e. $V_{SS,virt}(V_{DD})$.

Figure 5:
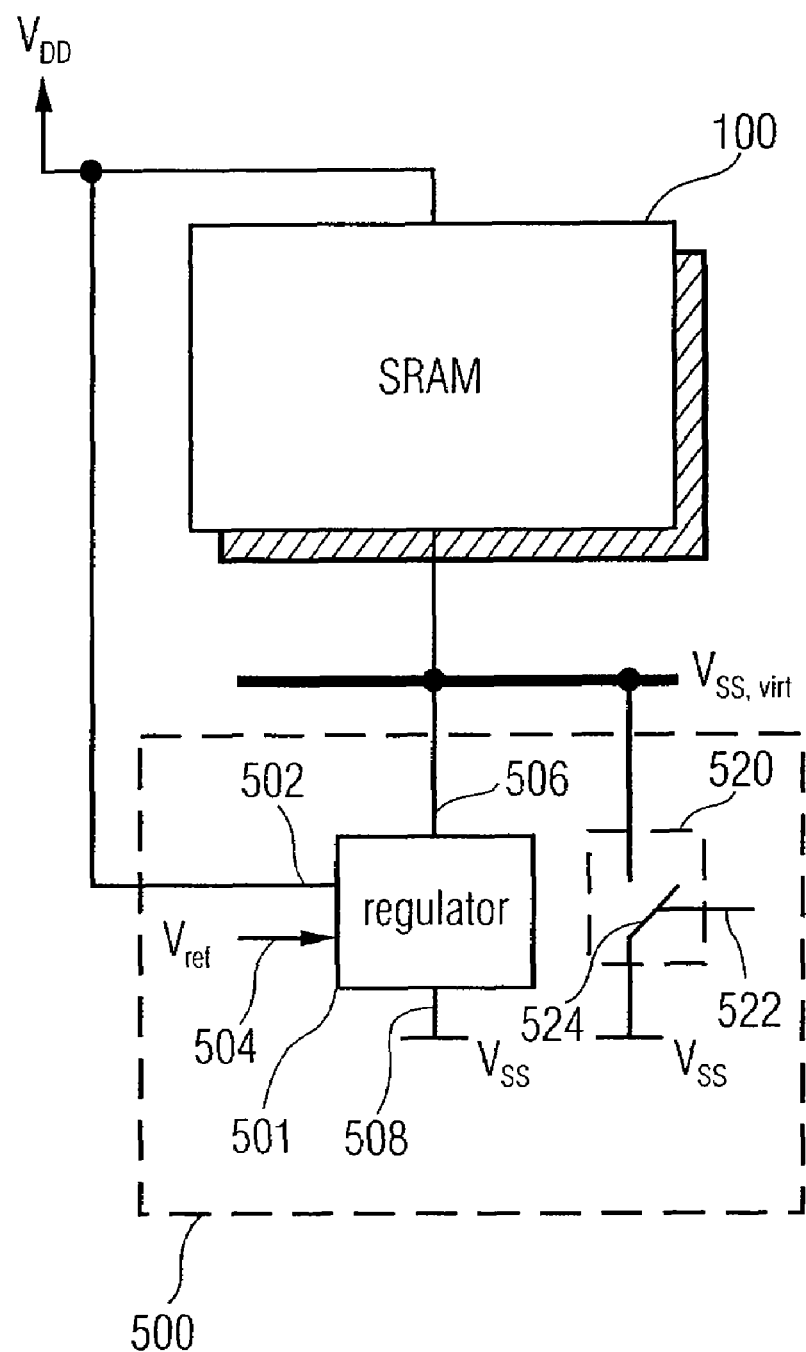
FIG. 5 a schematic illustration of an apparatus for reducing leaking currents of at least one transistor according to an embodiment of the present invention.

FIG. 5 shows an SRAM memory cell 100 which is connected between a supply potential $V_{DD}$ and a first reference potential $V_{SS,virt}$. Further, FIG. 5 shows an apparatus 500 for reducing leaking currents of at least one transistor of the SRAM memory cell 100 according to an embodiment of the present invention.

The apparatus 500 for reducing leakage currents has a means 501 for respectively controlling or regulating the first reference potential $V_{SS,virt}$, with a first input 502 for the supply potential, a second input 504 for a reference potential $V_{ref}$, a terminal 506 for the first reference potential $V_{SS,virt}$ to be regulated in dependence on the supply potential $V_{DD}$, and a terminal 508 for a second reference potential or ground potential $V_{SS}$, respectively. Thus, the means 500 for controlling the first reference potential $V_{SS,virt}$ is connected to the supply potential $V_{DD}$ at its first input 502, to the reference potential $V_{ref}$ at its second input 504, and the means 500 is connected to the first reference potential or virtual ground potential $V_{SS,virt}$, respectively, at its output 506, and the means 500 is connected to the second reference potential or ground potential $V_{SS}$, respectively, with its terminal 508.

In the embodiment of the present invention illustrated in FIG. 5, the apparatus 500 for reducing leakage currents further has a means 520 for selecting the first $V_{SS,virt}$ or the second reference potential $V_{SS}$, to select the reference potential for the at least one transistor of the SRAM memory cell 100. Thereby, the means 520 for selecting has an input for a selection signal 522 and a switch 524 depending on the selection signal 522, wherein a switch can switch between the first reference potential $V_{SS,virt}$ and the second reference potential $V_{SS}$ as reference potential for the at least one transistor.

FIG. 5 outlines schematically the structure of a circuit, which respectively controls or regulates the first reference potential or the virtual ground potential $V_{SS,virt}$, respectively, in dependence on the supply voltage $V_{DD}$. The means 501 for respectively controlling or regulating the first reference potential $V_{SS,virt}$ respectively controls or regulates the first reference potential $V_{SS,virt}$ such that data retention in the SRAM memory device 100 can always be guaranteed.

The means 520 for selecting can be a so-called sleep-control logic, which controls whether the first reference potential or the virtual ground potential $V_{SS,virt}$ or the "normal" ground potential $V_{SS}$ is applied to the SRAM memory device 100. Preferably, the virtual ground potential $V_{SS,virt}$ is selected when the SRAM memory device 100 is not accessed, which means when no data are written into the SRAM memory device or are read from the SRAM memory device, respectively.

The means 501 for respectively controlling or regulating the first reference potential $V_{SS,virt}$ can thereby, for example, have a differential amplifier which adjusts with its output, for example, a control voltage for a regulating transistor in dependence on $(V_{DD}-V_{ref})$. The first reference potential or the virtual ground potential $V_{SS,virt}$, respectively, can then, for example, be tapped at the source terminal of the regulating transistor.

Here, it should be noted that the means 501 for controlling or regulating, respectively, can be realized in different ways. The means 501 for controlling or regulating, respectively, generally has a control circuit which regulates the first reference potential or the virtual ground potential $V_{SS,virt}$, respectively, in dependence on the (varying) supply potential $V_{DD}$. The reference voltage $V_{ref}$ at the input of the means 501 for controlling can be provided, for example, via a so-called band gap circuit.

According to a further embodiment of the present invention, the means 501 for controlling or regulating, respectively, is implemented to maintain a difference between the supply potential $V_{DD}$ and the first reference potential or the virtual ground potential $V_{SS,virt}$, respectively, at least approximately constant, i.e. $(V_{DD}-V_{SS,virt}) \approx$ const. Therefore, for example, the difference $(V_{DD}-V_{SS,virt})$ can be applied to the input 502 of the means 501 for controlling or regulating, respectively, instead of the supply potential $V_{DD}$.

Simulations show that with a circuit illustrated in FIG. 5 having an inventive apparatus for reducing leakage currents, data retention can be guaranteed over a longer time period compared to a (necessarily low) fixed virtual ground potential.

Figure 6:
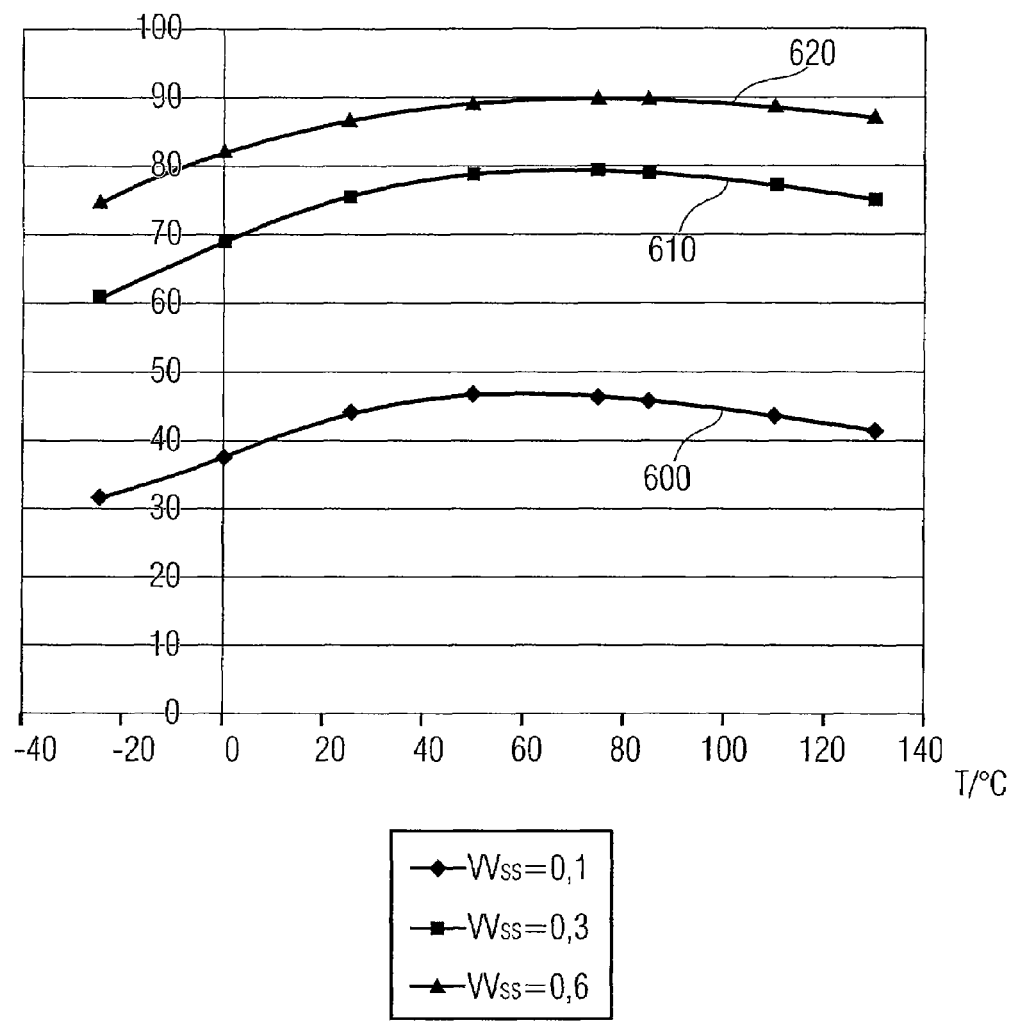
FIG. 6 a diagram for illustrating the reduction of leakage currents for different virtual ground potentials plotted against different temperatures.

FIG. 6 schematically shows reductions of leakage currents in a transistor for different virtual ground potentials $V_{SS,virt}$ plotted over different temperature values against a ground potential $V_{SS}=0$ V.

The curve designated by reference number 600 describes leakage current reductions at a virtual ground voltage $V_{SS,virt}=0.1$ V and a supply voltage $V_{DD}=1.5$ V compared to a ground potential $V_{SS}=0$ V. The curve designated by reference number 610 describes leakage current reductions at a virtual ground voltage $V_{SS,virt}=0.3$ V and a supply voltage $V_{DD}=1.5$ V compared to a ground potential $V_{SS}=0$ V. The curve designated by reference number 620 describes leakage current reductions at a virtual ground voltage $V_{SS,virt}=0.6$ V and a supply voltage $V_{DD}=1.5$ V compared to a ground potential $V_{SS}=0$ V.

Thus, FIG. 6 shows clearly that a significant leakage current reduction can be obtained with the inventive concept, since respectively controlling or regulating the virtual ground voltage $V_{SS,virt}$ in dependence on $V_{DD}$ provides for $V_{SS,virt}$ lying between $V_{SS}$ and $V_{DD}$ in amount, and thus the data retention voltage ($V_{DD}-V_{SS,virt}$) does not become unnecessarily high.

Figure 7:
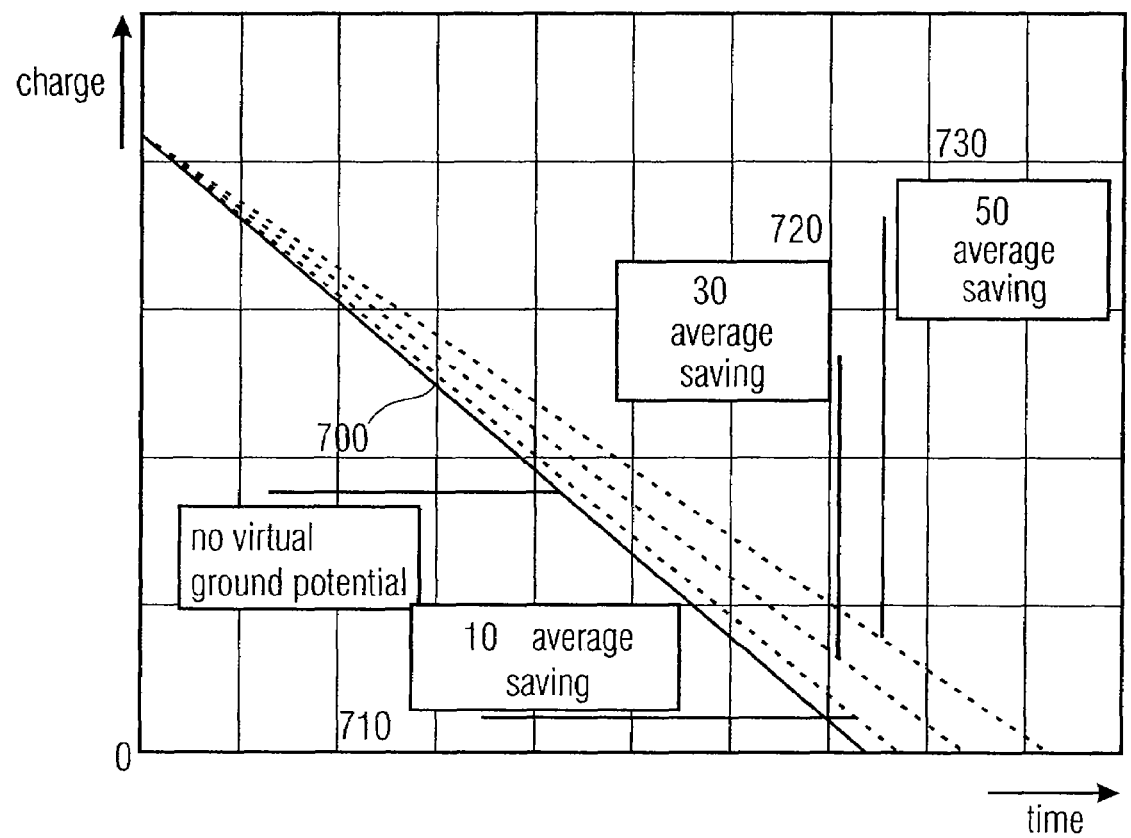
FIG. 7 a diagram for illustrating the influence of the virtual ground potential on the duration of the data retention, when no charge is supplied from the supply voltage source.

FIG. 7 shows schematically an influence of the virtual ground potential $V_{SS,virt}$ on a period of the data retention of a typical SRAM memory cell according to FIG. 1, when no charge is supplied from a voltage source with the supply voltage $V_{DD}$.

The curve designated by reference number 700 shows schematically the drop of the charge stored in the SRAM memory cell when no virtual ground potential is used, i.e. for example $V_{SS,virt}=V_{SS}=0$ V. The curve designated by reference number 710 describes the drop of a charge stored in the SRAM memory cell when an average reduction of the leaking currents of 10% (pessimistic) is assumed by a dynamic change of the virtual ground potential $V_{SS,virt}$ in dependence on $V_{DD}$. The curve designated by reference number 720 shows the charge drop in a typical SRAM memory cell when, by dynamically changing the virtual ground potential $V_{SS,virt}$ in dependence on $V_{DD}$, an average reduction of the leakage currents of 30% is assumed. Finally, the curve designated by reference number 730 shows the change of the charge stored in an SRAM memory cell over time when, by dynamically changing the virtual ground potential $V_{SS,virt}$ in dependence on $V_{DD}$, an average reduction of the leakage currents of 50% (very optimistic) is assumed.

On the time axis of FIG. 7, extensions of the data retention time of 10% to 30% due to the inventive concept can be read compared to the data retention time without virtual ground potential. By the inventive concept, a virtual ground potential $V_{SS,virt}$ can be fixed very high at the beginning of a discharge curve, i.e. when the supply voltage $V_{DD}$ is interrupted, whereby leakage currents can be reduced over the whole discharge period. The means 501 for respectively controlling or regulating the virtual ground potential $V_{SS,virt}$ in dependence on the supply potential $V_{DD}$ thus provides for the fact that the virtual ground potential $V_{SS,virt}$ is also relatively high at a relatively high supply potential $V_{DD}$, and thus a difference between the supply potential $V_{DD}$ and the virtual ground potential $V_{SS,virt}$ can be set higher than the data retention voltage.

Thus, it is an advantage of the present invention that by controlling the virtual ground potential $V_{SS,virt}$ in dependence on the supply potential $V_{DD}$, a high reduction of leakage currents of at least one transistor connected between the supply potential $V_{DD}$ and the virtual ground potential $V_{SS,virt}$ can be enabled. If the supply voltage $V_{DD}$ is high, the virtual ground potential $V_{SS,virt}$ is also regulated correspondingly high by the inventive means 501 for respectively controlling or regulating the virtual ground potential $V_{SS,virt}$ in dependence on the supply potential $V_{DD}$, such that a difference between the supply potential $V_{DD}$ and the virtual ground potential $V_{SS,virt}$ is always higher or equal to the required minimum data retention voltage. At a low supply voltage $V_{DD}$, data retention in an SPAM memory cell is still guaranteed, since the inventive apparatus 500 for reducing leakage currents via the means 501 for respectively controlling or regulating the virtual ground potential can guarantee a minimum distance between the supply potential $V_{DD}$ and the ground potential $V_{SS,virt}$. However, this can only be ensured as long as the supply potential $V_{DD}$ does not become smaller than the minimum required data retention voltage.

Depending on the circumstances, the inventive method for reducing leakage currents can be implemented in hardware or in software. The implementation can be made on a digital memory medium, particularly a disc, CD, DVD or ROM, PROM, flash, EEPROM or another non-volatile memory medium of electronically readable control signals, which can cooperate with a programmable computer system, particularly the embodiment of an embedded microcontroller or embedded DSP, which is particularly advantageous for integrated systems, such that the corresponding method is executed. Generally, thus, the invention also consists of a computer program product with a machine-readable program code stored on a carrier for performing the inventive method when the computer program product runs on a computer. In other words, the invention can be realized as a computer program with a program code for performing the method when the computer program runs on a computer.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. An apparatus for reducing a leakage current of an integrated circuit comprising at least one transistor connected between a supply potential and a first reference potential, comprising:
    a controller configured to control the first reference potential in dependence on the supply potential, such that a difference between the supply potential and the first reference potential is maintained at a substantially constant value equal to or higher than a required minimum data retention voltage.

2. The apparatus according to claim 1, wherein the apparatus further comprises a selector configure to select the first or a second reference potential as reference potential for the at least one transistor, wherein the first reference potential lies in amount between the second reference potential and the supply potential.

3. The apparatus according to claim 1, wherein the at least one transistor is part of an SRAM memory device.

4. The apparatus according to claim 2, wherein the selector is configured to select the second reference potential for a normal operation of an SRAM memory device and select the first reference potential for an energy-saving mode of the SRAM memory device.

5. The apparatus according to claim 1, wherein the at least one transistor is an NMOS transistor.

6. An apparatus for leakage current reduction for an integrated circuit comprising at least one transistor, comprising:
    a reference potential regulator comprising a first input for a supply potential, a second input for a reference potential, a terminal for a first reference potential to be regulated in dependence on the supply potential, such that a difference between the supply potential and the first reference potential is maintained at a substantially constant value equal to or higher than a required minimum data retention voltage, and a terminal for a second reference potential, wherein the at least one transistor is connected between the supply potential and the first reference potential.

7. The apparatus for leakage current reduction according to claim 6, wherein the apparatus for leakage current reduction further comprises a selector connected between the first and the second reference potential, wherein the selector can select the first or the second reference potential as reference potential for the at least one transistor.

8. The apparatus for leakage current reduction according to claim 6, wherein the first reference potential lies in amount between the supply potential and the second reference potential.

9. The apparatus for leakage current reduction according to claim 6, wherein the at least one transistor is part of an SRAM memory device.

10. The apparatus for leakage current reduction according to claim 6, wherein the selector is configured to select the second reference potential for a normal operation of the SRAM memory device and select the first reference potential for an energy-saving mode of the SRAM memory device.

11. An apparatus, comprising:
a supply potential terminal;
a reference potential terminal;
a transistor device connected between the supply potential terminal and the reference potential terminal; and
a regulating circuit comprising an input for a supply potential signal and an output for a first reference potential signal adjustable in dependence on the supply potential signal, such that a difference between the supply potential signal and the first reference potential signal is maintained at a substantially constant value equal to or higher than a required minimum data retention voltage, wherein the input is connected to the supply potential terminal, and wherein the output is connected to the reference potential terminal.

12. The apparatus according to claim 11, wherein the apparatus further comprises a selection circuit comprising an input for a selection signal and a switch depending on the selection signal, wherein the switch is configured to apply the first reference potential or a second reference potential to the transistor device as reference potential.

13. The apparatus according to claim 12, wherein the first reference potential lies in amount between the supply potential and the second reference potential.

14. The apparatus according to claim 12, wherein the transistor device is part of an SRAM memory device.

15. The apparatus according to claim 11, wherein the selection circuit is configured to select the second reference potential for a normal operation of the SRAM memory device and select the first reference potential for an energy-saving mode of the SRAM memory device.

16. An SRAM memory device comprising an apparatus for reducing a leakage current of an integrated circuit comprising at least one transistor connected between a supply potential and a first reference potential, comprising:
a controller configured to control the first reference potential in dependence on the supply potential, such that a difference between the supply potential and the first reference potential is maintained at a substantially constant value equal to or higher than a required minimum data retention voltage, to retain stored data.

17. An SRAM memory device comprising an apparatus for leakage current reduction for an integrated circuit comprising at least one transistor, comprising:
a reference potential regulator comprising a first input for a supply potential, a second input for a reference potential, a terminal for a first reference potential to be regulated in dependence on the supply potential, such that a difference between the supply potential and the first reference potential is maintained at a substantially constant value equal to or higher than a required minimum data retention voltage, to retain stored data, and a terminal for a second reference potential, wherein the at least one transistor is connected between the supply potential and the first reference potential.

18. An SRAM memory device comprising an apparatus, comprising:
a supply potential terminal;
a reference potential terminal;
a transistor device connected between the supply potential terminal and the reference potential terminal; and
a regulating circuit comprising an input for a supply potential signal and an output for a reference potential signal adjustable in dependence on the supply potential signal, such that a difference between the supply potential signal and the reference potential signal is maintained at a substantially constant value equal to or higher than a required minimum data retention voltage, to retain stored data, wherein the input is connected to the supply potential terminal, and wherein the output is connected to the reference potential terminal.

19. A method for reducing leakage currents of an integrated circuit comprising at least one transistor, wherein the at least one transistor is connected between a supply potential and a first reference potential, comprising:
controlling the first reference potential in dependence on the supply potential, such that a difference between the supply potential and the first reference potential is maintained at a substantially constant value equal to or higher than a required minimum data retention voltage.

20. The method according to claim 19, further comprising selecting the first reference potential or a second reference potential as reference potential for the at least one transistor, wherein the first reference potential lies in amount between the second reference potential and the supply potential.

21. The method according to claim 19, wherein the first reference potential is controlled such that a difference of the supply potential and the first reference potential is always higher than 0.5 volt.

22. A computer program comprising a program code for performing the method for reducing leakage currents of an integrated circuit comprising at least one transistor, wherein the at least one transistor is connected between a supply potential and a first reference potential, comprising:
controlling the first reference potential in dependence on the supply potential, such that a difference between the supply potential and the first reference potential is maintained at a substantially constant value equal to or higher than a required minimum data retention voltage,
when the computer program runs on a computer.

* * * * *